(12) United States Patent
Aipperspach et al.

(10) Patent No.: US 6,205,063 B1
(45) Date of Patent: Mar. 20, 2001

(54) APPARATUS AND METHOD FOR EFFICIENTLY CORRECTING DEFECTS IN MEMORY CIRCUITS

(75) Inventors: Anthony Gus Aipperspach; Sheldon Bernard Levenstein, both of Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/140,031

(22) Filed: Aug. 26, 1998

(51) Int. Cl.$^7$ ................................................ G11C 7/00
(52) U.S. Cl. ................................. 365/200; 365/225.7
(58) Field of Search ............................. 365/200, 225.7, 365/230.03

(56) References Cited

U.S. PATENT DOCUMENTS 5,657,280 * 8/1997 Shin et al. ............................ 365/200
5,999,463 * 12/1999 Park et al. ........................... 365/200

* cited by examiner

*Primary Examiner*—Vu A. Le
(74) *Attorney, Agent, or Firm*—Lawrence D. Maxwell (57) ABSTRACT

Defects in memory circuit (100) are efficiently corrected by selectively blowing fuses in a first plurality of fuses to describe a cell location of a defective cell within any of several memory array portions (110). Fuses in a second plurality of fuses are blown to describe indicate the particular memory array portion (112) containing the defective memory cell. During operation of the memory circuit (100), the cell location is forwarded to the memory array portion (112) containing the defective memory cell and a redundant memory cell (206) is used for data storage at the memory array portion (112) having a defective memory cell.

24 Claims, 5 Drawing Sheets

APPARATUS AND METHOD FOR EFFICIENTLY CORRECTING DEFECTS IN MEMORY CIRCUITS

BACKGROUND OF THE INVENTION

1. Field of the Invention

The present invention relates in general to memory devices and specifically to a method and apparatus for efficiently correcting defects in memory arrays.

2. Description of the Related Art

Memory arrays, like other electronic circuit components, are susceptible to manufacturing defects and failure. Memory arrays are typically fabricated on an integrated circuit chip, which may be a dedicated memory chip or may include other circuit components. Defects in a memory array may be caused by fabrication errors or improper handling. Environmental factors, age or improper use can cause a memory array to fail at any time.

As a result, techniques have been developed to correct defects in memory arrays. One attempt at correcting defects in arrays includes designing the array to include redundant memory cells. The redundant cells are employed by selectively blowing fuses within an array of fuses connecting the array of cells after determining which cells are defective. When the memory array is operated, storage information is routed to redundant cell locations based on which fuses are blown. In current designs, the arrangement of fuses is such that particular fuses are dedicated to a particular portions of the memory array. Therefore, in order to allow for correction of cells in different portions of the memory array, multiple fuse groups must be implemented. As a result, the number of fuses increases with the number of potential repairable defects, the number of redundant cells and the number of memory array portions.

Static Random Access Memory (SRAMS) arrays employ Field Effect Transistors (FETs) for memory cells. As technologies continually develop to reduce the size of FETs and logic circuitry, technologies for reducing the size of fuses are not improving as quickly. As a result, the area dedicated for fuses on logic chips is increasing in relation to the area dedicated for logic circuitry.

Therefore, there exists a need for a method and apparatus for correcting defects in memory arrays with minimal increase in circuit area.

SUMMARY OF THE INVENTION

The present invention relates to efficiently correcting defects in memory circuits with minimal increase in circuit area.

In an embodiment of the invention, a memory circuit contains a fuse circuit, a fuse controller and a memory array. After the memory array is tested to determine the locations of defective memory cells within the memory array, a fuse circuit containing a plurality of fuses is "coded" to describe the memory cell location. The fuse circuit contains at least two groups of fuses: a first plurality of fuses that are coded or "blown" to describe a memory cell location within any of several portions of the memory array and a second plurality of fuses coded to indicate the particular portion of the memory array that contains the defective memory cell.

During operation of a memory circuit, the fuse controller forwards the cell location to the memory array portion that has the defective memory cell based on the information coded within the second plurality of fuses. The memory array portion activates a redundant memory cell when an incoming address matches the cell location forwarded by the fuse controller from the fuse circuit. Storage data is stored in the redundant memory cell and not the defective memory cell.

Since fuses are associated with a particular memory array portion after the locations of the defective memory cells are determined, fuses are efficiently allocated to identify the defective memory cells throughout the memory array. The number of fuses can be reduced while still allowing for the correction of defects within the memory array. Therefore, circuit area is efficiently utilized for fuses while still allowing for correction of defective memory cells.

BRIEF DESCRIPTION OF THE DRAWINGS

For a more complete understanding of the present invention, reference is now made to the following detailed description of the embodiments illustrated in the accompanying drawings, wherein.

DESCRIPTION OF PREFERRED EMBODIMENTS

Figure 1:
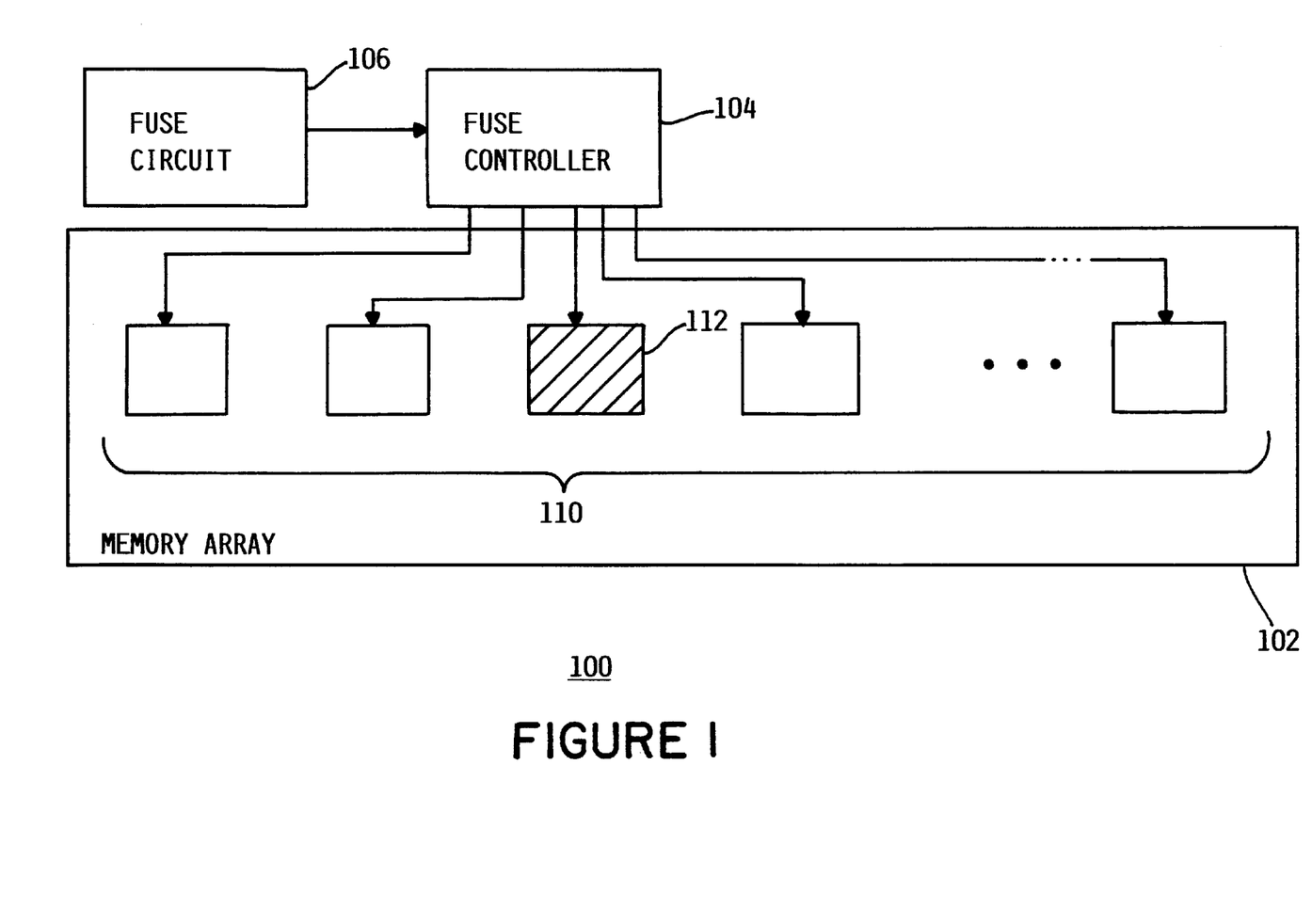
FIG. 1 is a block diagram of a memory circuit 100 in accordance with a first embodiment of the present invention.

FIG. 1 is a block diagram of a memory circuit 100 in accordance with a first embodiment of the invention. A memory array 102 is connected to a fuse controller 104 and a fuse circuit 106.

The memory array 102 is arranged in memory array portions 110. Preferably, the memory array 102 is a static random access memory (SRAM) array and contains 48 memory array portions 110 produced using Complementary Metal Oxide Semiconductor (CMOS) technology. However, the memory array 102 may be implemented using any of several technologies and materials including Dynamic Random Access Memory (DRAM), Gallium Arsenide (GaAs), Silicon On Insulator (SOI) techniques and processes. The memory circuit 100 may be manufactured as a discrete device or may be implemented as part of a integrated circuit having multiple functions and utilizing various technologies and processes. Each memory array portion 110 may contain any number of memory cells consistent with the manufacturing process and will be discussed in detail below with reference to FIG. 2.

The fuse circuit 106 contains a plurality of fuses arranged into several groups containing a plurality of fuses. The fuses are implemented using known technologies and are initially short circuits to ground. After a defective memory cell is located within the memory array 102 and the defective memory array portion 112 is determined, the fuses are selectively opened or "blown". Preferably, the fuses are blown using laser cutting techniques as known in the art.

The fuses are opened such that the fuse circuit 106 indicates which memory array portion 112 (110) is defective and describes a cell location of the defective memory cell within the defective memory array portion 112.

During operation of the memory circuit, the fuse controller 104 determines which of the plurality of memory array portions 110 contains a defective memory cell based on information supplied by the fuse circuit 106. The fuse controller 104 forwards the information indicating the cell location to the defective memory array portion 112. Preferably, the fuse controller 104 is implemented using logic circuitry.

As explained below in reference to FIG. 2, the defective memory array portion 112 compares the cell location information to an incoming address signal. If the cell location matches the address, the defective memory array portion 112 stores memory information in a redundant memory cell rather than the defective memory cell located in the cell location.

The number of fuses contained in the fuse circuit 106 is proportional to the number of defective memory cells within the memory circuit 102 that can be corrected. The number of fuses does not exclusively dictate the number of possible corrections since the number of repairs depends on other factors such as the organization of the memory array 102, the number and size of redundant cells, the size of the memory array, and the locations of the defective memory cells. Since the fuses can be coded to indicate the memory array portion 112 that contains the defective memory cell, fuses can be used more efficiently than in designs where fuses can only be used for a particular memory array portion 112.

As is explained below in reference to FIG. 2, the number of fuses in the fuse circuit 106 is determined by statistical data of the particular manufacturing process of the memory circuit including the manufacturing yields of memory arrays with a particular number of defective memory cells, manufacturing costs, desired circuit size, reliability of memory arrays in relation to number of defective memory cells and other factors known by those skilled in the art.

Figure 2:
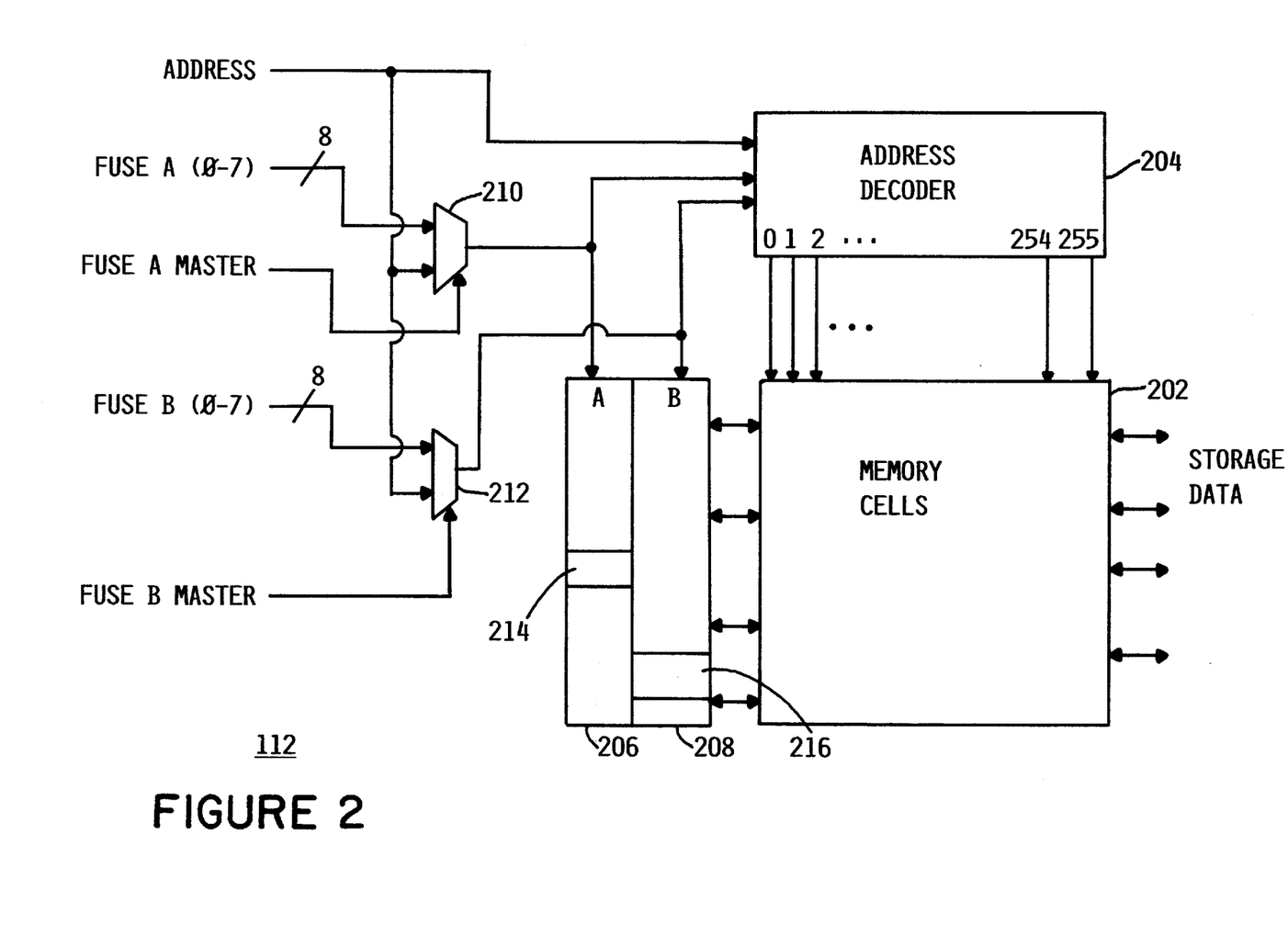
FIG. 2 is a block diagram of a memory array portion 110 in accordance with the first embodiment of the invention.

FIG. 2 is a block diagram of a memory array portion 112 in accordance with the first embodiment of the invention. Memory cells 202, organized in rows and columns, are coupled to an address decoder 204 that activates the appropriate cells of the memory cells 202 to store and retrieve storage data. The address decoder 204 receives an address describing the location of the memory cell that will either be used for storage or from which storage data is being retrieved.

The memory array portion 112 also contains at least one redundant memory cell 214, 216. In the first embodiment, redundant column A 206 contains a column of redundant memory cells 214. Similarly, a redundant column B 208 contains a column of redundant memory cells 216. The redundant columns 206, 208 are coupled to the memory cells 202 such that storage data can be stored and retrieved from the redundant cells 214, 216. The redundant cells 214, 216 are used to store storage data when the address specifies a defective cell within the memory cells 202. In other words, a redundant cell such as redundant cell 214 is substituted for a defective cell within the memory cells 202. Preferably, the entire column within the memory cells 202 containing the defective memory cell is substituted with the redundant column 206.

In the first embodiment, the memory array portion 112 contains two redundant columns of cells 206, 208 allowing for two repair actions. However, the number, size and shape of the redundant cells 206 are determined by statistical analysis of various parameters using known techniques. Any number of redundant cells 214, 216 can be used and will typically be determined by the memory cell manufacturing process, the number of defective cells that can be expected in the memory array portion 112, the amount of available space in memory array portion 112 that can be used for redundant cells and a predetermined acceptable number of defective cells within the memory array portion 112. For example, for a memory circuits produced as in the first embodiment (memory circuits having 48 memory array portions containing 256 locations), 95% of the memory circuits produced can be repaired by eight repair actions or less if a known manufacturing process is used to make the memory circuits. In addition, reliability of memory circuits of this size requiring more than eight repair actions decreases significantly. In the first embodiment, any memory circuit produced requiring more than eight repairs is discarded.

It is noted that in the first embodiment, it may be possible to repair more than two defective cells in the memory array portion 112. Each of the redundant column of cells 206, 208 contains an entire column of memory cells and, therefore, multiple repairs can be made if defective cells are in the same column within the memory cells 202 with one of the redundant columns 206, 208.

Continuing with FIG. 2, a first comparator 210, compares defective cell location information (FUSE_A) sent from the fuse controller 104 to the incoming address. In the first embodiment, the address and the FUSE_A signal are 8 bits. The first comparator 210 activates redundant column A 206 only if the defective cell information matches the address and a fuse A master signal indicates that the redundant column A 206 should be used. In the first embodiment, the fuse controller 104 indicates that the redundant column A 206 should be used by setting the fuse A master signal to a logic HI. If there is a match and the FUSE_A_MASTER signal is HI, the comparator produces an appropriate control signal at an output of the first comparator 210. The control signal activates redundant column A 206 and indicates to the address decoder that redundant column A 206 will be used. The address decoder allows the storage data intended for the defective cell to pass through the memory cells and to be stored and retrieved from the redundant cells 214 when the control signal indicates that the redundant column 206 is being used.

A second comparator 212, compares the address to a FUSE_B signal describing the location of a second defective cell within a memory array portion 112. Redundant column B 208 is activated if there is match and a FUSE_B_MASTER signal indicates that redundant column B should be used. A control signal from the second comparator indicates to the address decoder that redundant column B 208 is being used. As a result, the address decoder allows data storage intended for the second defective cell to be stored and retrieved from redundant cells 216. Although in the first embodiment the memory array portions 110 contain two redundant columns 206, 208 containing many redundant cells 214, 216, any number of redundant cells may be used depending on the manufacturing process and the desired number of potential repairs per memory array portion 110.

It is noted that the redundant cells 214, 216 within a redundant column 206, 208 may be organized logically by the decoder such that the cells within the redundant column 206 apply to addresses pertaining to multiple columns within the memory cells 202. By organizing the cells into "shapes" other than a column, more efficient use of the redundant cells 214, 216 can be made. For example, rather than defining a redundant column 206 to be one cell wide and 256 cells long, the redundant column 206 could be defined as four cells wide and 64 cells long. Such techniques are known and allow for substituting a particular area not defined as a one cell column within the memory cells 202 with the redundant cells.

Since the fuses are not dedicated to a particular memory array portion 110, the fuses can be opened to describe a particular memory portion 112 and the defective memory cell within the memory portion 112 while limiting the total number of fuses needed for the memory circuit 100. This results in a significant decrease in the number of fuses need for a memory circuit 100. For example, if a memory circuit were repaired using traditional methods, a total of 432 fuses would be needed to allow for repair of a memory array portion 110 having two defects while only 120 fuses are needed using the method discussed above. Using traditional methods, for each memory array portion 110, eight fuses are needed to describe the eight bit address of a defective cell and one fuse is needed for an on/off control. Therefore, the total number of fuses needed for a memory circuit 100 having 48 memory portions 110 is nine times 48 which is equal to 432.

However, if it is predetermined that memory circuit requiring more than eight repairs will be discarded, the fuse circuit 106, as described above, requires only 120 fuses. The fuse circuit 106 requires eight fuses for each repair action, one on/off bit plus six additional fuses to direct the information to the appropriate memory array portion 110. Therefore, the total number of fuses required to repair eight defective cells in the memory circuit is 15 times eight which is equal to 120.

Figure 3A:
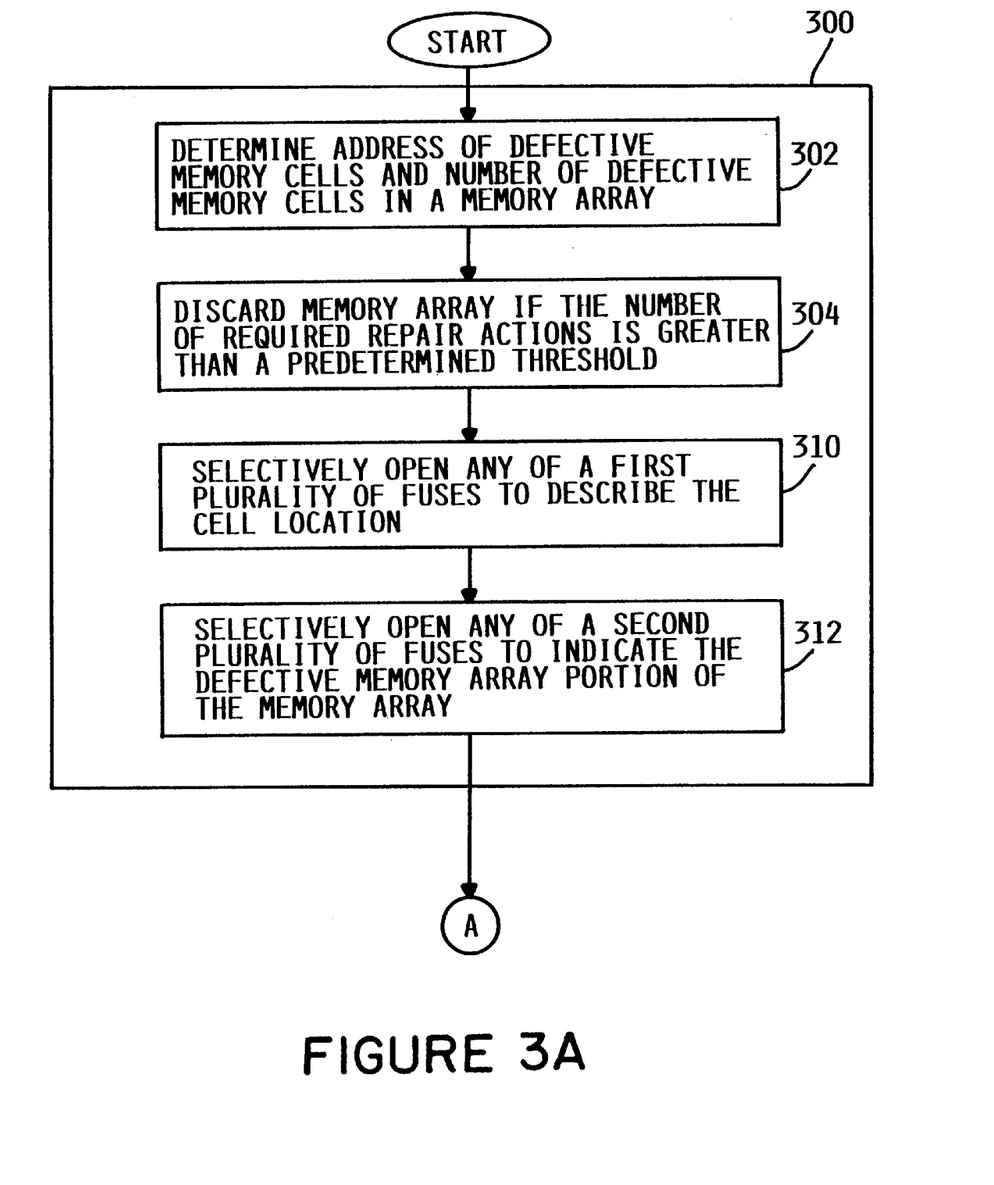
FIG. 3 is a flow chart of a method in accordance with the first embodiment of the invention.
Figure 3B:
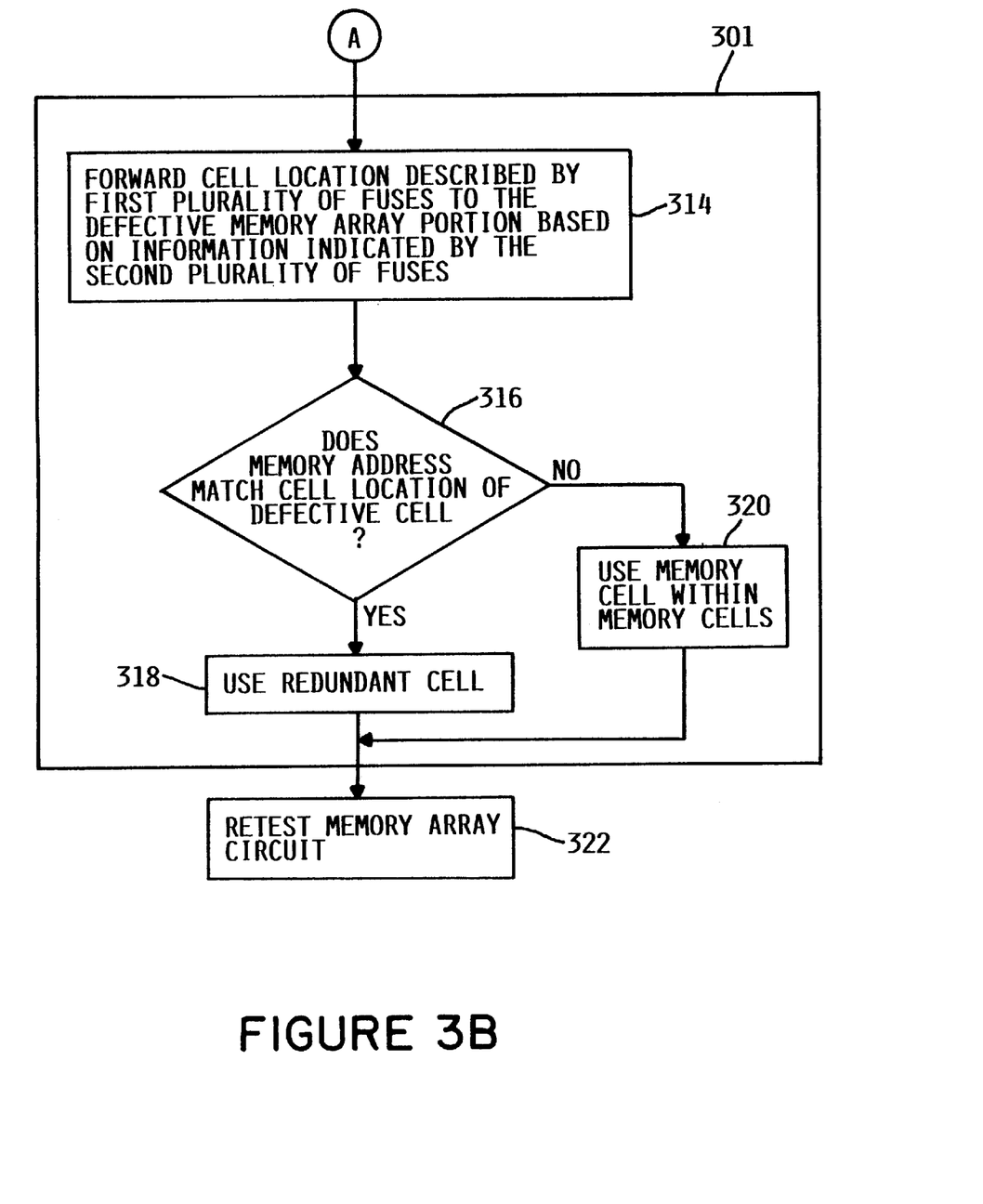

FIG. 3 is a flow chart of a method in accordance with the first embodiment of the invention. At step 300 (which includes steps 302 through 312), the fuse circuit is modified in accordance with the location of defective memory cells within the memory circuit 100. Step 300 is preferably performed as part of the manufacturing process.

At step 301, the memory circuit 100 routs the information supplied by the fuse circuit 106 to the appropriate memory array portion 110 in order to replace defective memory cells with redundant cells 106. Step 301 includes steps 314 through 320 and typically is performed when the memory circuit 100 is in use or "in the field". However, during the manufacturing process, step 301 is performed in order to proceed to step 322 where the memory circuit is retested.

At step 322, the memory circuit is retested to determine if it performing properly when the redundant cells 206, 208 are in use. If the any of the utilized redundant cells 206, 208 are defective or if the memory circuit does not operate properly, the memory circuit is discarded.

Step 300 begins at step 302 where the memory array 102 is tested to determine the number and location of any defective cells. The cell locations (addresses) of the defective cells are determined including the particular memory array portion 110 (112) that contains a defective memory cell. The cell location of each of the defective memory cells and the address of the associated memory array portion 112 is recorded. Any of several known techniques may be used to determine the number of defective cells and their locations.

At step 304, the memory array 102 is discarded if the number of required repairs is greater than a predetermined threshold. In the first embodiment, the memory array 102 is discarded if the number of defective cells exceeds eight. As described above in reference to FIG. 2., the predetermined threshold is determined by various factors and depends on the type of manufacturing process. As noted above, it is possible to repair more than eight defective cells with only eight repairs if two or more defective cells are in the same column of memory cells 202.

At step 310, fuses are selectively opened within a first plurality of fuses in the fuse circuit 106 to describe the cell location of the defective cell. Preferably, the fuses are opening by laser cutting as described above.

At step 312, fuses are selectively opened within a second plurality of fuses in the fuse circuit 106 to indicate the defective memory array portion 112 of the memory array 102. The fuses are preferably opened using laser cutting techniques.

Step 301 begins at step 314 where the cell location described by the first plurality of fuses is forwarded to the defective memory array portion 112 based on information indicated by the second plurality of fuses. As described above, in the first embodiment, the fuse controller 104, deciphers the information indicated by the opened fuses and sends the cell location of the defective cell to the memory array portion 112 having the defective cell. The memory location is forwarded to the appropriate memory array portion 112 by activating a comparator 210, 212 at the appropriate memory array portion 112.

At step 316, an incoming memory address is compared to the cell location described by the first plurality of fuses. In the first embodiment, the comparator 210 compares the memory address to the FUSE_A signal sent by the fuse controller 104. If there is a match and the FUSE_A_MASTER signal indicates that the redundant cells A should be used for the particular memory array portion 112, the method proceeds to step 318.

At step 318, the memory array portion 112 activates the redundant cells A 206 and stores storage data or retrieves storage data from redundant cells A 206.

If the comparator 210 determines that the memory address does not match the cell location (FUSE A) of the defective cell, the method continues at step 320 where the memory cell described by the memory address is used. Therefore, when the memory address does not match cell location of the defective cell, a memory cell within the memory cells is used.

Figure 4:
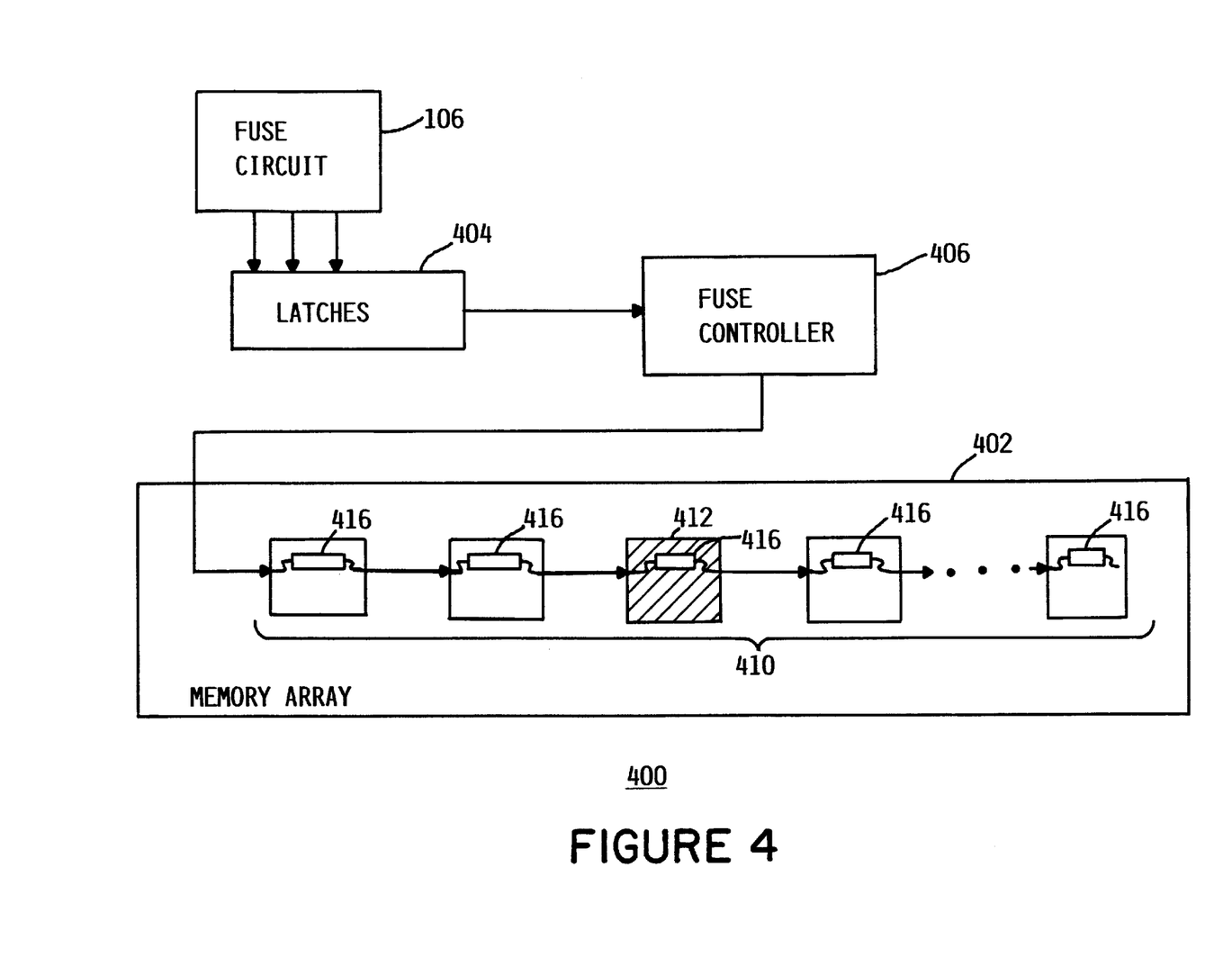
FIG. 4 is a block diagram memory circuit 400 in accordance with a second embodiment of the invention.

FIG. 4 is a block diagram of a memory circuit 400 in accordance with a second embodiment of the invention. The second embodiment differs from the first embodiment in that a serial port is used to forward the cell location and other information described by the fuse circuit 106 to the fuse controller 406 and the memory array portions 410. Otherwise, the second embodiment operates as described above in regard to the first embodiment. The memory array 402 differs from memory array 100 in that a serial data signal from the fuse controller is distributed to the memory array portions 410 of the memory array 402.

Latches 404 (also commonly referred to as a shift register) convert the parallel signals supplied by the fuse circuit 106 to a serial signal as is known. The controller 406 deciphers the serial signal and forwards the cell location of the defective memory cell to the defective memory array portion 412 by producing a serial data signal.

The memory array portions 410 perform as described above regarding memory array portions 110 except for receiving and deciphering a serial signal from the fuse controller 406 to determine which memory array portion 410 is being supplied the cell location. Each of the memory array portions 410 contains latches 416 that are designed, using known techniques, to "lock" onto the data in the serial data stream intended for corresponding memory array portion 410.

As described above in the previous two examples, defects in a memory circuit 100, 400 are efficiently corrected by selectively opening fuses in a fuses circuit 106. A fuses within a first plurality of fuses are opened to describe the cell location of a defective cell in a memory array portion 112 and fuses with a second plurality of fuses are opened to indicate which of the memory array portions 110, 410 contains the defective memory cell. During operation of the memory circuit 100, 400, the cell location is forwarded to the appropriate memory array portion (defective memory array portion 112, 412). Comparators at the defective memory portion 112, 412 determine if a redundant cell should be used by comparing the cell location to the incoming memory address. If there is match, indicating that the memory cell described by the memory address is defective, the redundant cell is used for storage.

Other embodiments and modifications of the present invention will occur readily to those of ordinary skill in the art in view of these teachings. Such persons will appreciate the symmetries among the various embodiments illustrated above and understand that their elements may be arranged in other ways to produce similar results. For example, the symmetry between FIGS. 1 and 4 is intended to illustrate that the cell location may be forwarded to the appropriate memory array portion in different ways without departing from the scope of the invention. Similarly, signals and their complements may be inverted from the designations in the illustrated embodiments without departing from the scope of the invention. Therefore, this invention is to be limited only by the following claims, which include all such other embodiments and modifications when viewed in conjunction with the above specification and accompanying drawings.

What is claimed is:

1. A fuse circuit for indicating a defective memory cell within a memory array, the fuse circuit comprising:
    a first plurality of fuses selectively opened to describe a first cell location within any of a plurality of memory array portions of the memory array; and
    a second plurality of fuses associated with the first plurality of fuses and selectively opened to indicate a first defective memory portion of the plurality of memory array portions.

2. A fuse circuit in accordance with claim 1 wherein the plurality of memory array portions is a plurality of static random access memory (SRAM) arrays within the memory array and the defective memory portion is a defective SRAM array of the plurality of SRAM arrays having a defective memory cell.

3. A fuse circuit in accordance with claim 1 further comprising:
    a third plurality of fuses selectively opened to describe a second cell location within any of the plurality of memory array portions of the memory array; and
    a fourth plurality of fuses associated with the third plurality of fuses and selectively opened to indicate a second defective memory portion of the plurality of memory array portions.

4. A fuse circuit in accordance with claim 3 wherein a first memory cell located at the first cell location within the first defective memory portion is defective and wherein a second memory cell located at the second cell location within the second defective memory portion is defective.

5. A memory circuit comprising:
    a memory array having a plurality of memory cells arranged in a plurality of memory array portions of the memory array;
    a fuse circuit adapted to describe a cell location within any one of the plurality of memory array portions and adapted to indicate a defective memory array portion; and
    a fuse controller adapted to forward the cell location described by the fuse circuit to the defective memory portion based on information indicated by the fuse circuit.

6. A memory circuit in accordance with claim 5 wherein the fuse circuit comprises:
    a first plurality of fuses selectively opened to describe the cell location within any one of the plurality of memory array portions; and
    a second plurality of fuses associated with the first plurality of fuses and selectively opened to indicate the defective memory portion.

7. A memory circuit in accordance with claim 5 wherein the defective memory portion comprises a comparer circuit coupled to the fuse controller, the comparer circuit adapted to activate a first redundant memory cell based on a comparison of the first cell location and a memory address.

8. A memory circuit in accordance with claim 7, the redundant memory cell adapted to store memory information when activated.

9. A memory circuit in accordance with claim 8 wherein the plurality of memory array portions is a plurality of static random access memory (SRAM) arrays within the memory array and the defective memory portion is a defective SRAM array of the plurality of SRAM arrays having a defective memory cell.

10. A memory circuit in accordance with claim 8 wherein the fuse controller is adapted to forward the fuse information to the defective memory array portion by a serial data stream.

11. A memory circuit comprising:
    a memory array having a plurality of memory cells arranged in a plurality of memory array portions of a memory array;
    a fuse circuit having a first plurality of fuses selectively opened to describe a first cell location within any of the plurality of memory array portions and having a second plurality of fuses associated with the first plurality of fuses and selectively opened to indicate a defective memory portion of the plurality of memory array portions; and
    a fuse controller adapted to forwarding the first cell location described by the first plurality of fuses to the defective memory portion based on information indicated by the second plurality of fuses.

12. A memory circuit in accordance with claim 11 wherein the defective memory portion comprises a comparer circuit coupled to the fuse controller, the comparer circuit adapted to activate a first redundant memory cell based on a comparison of the first cell location and a memory address.

13. A memory circuit in accordance with claim 11 wherein the fuse circuit comprises:
    a third plurality of fuses selectively opened to describe a second cell location within any one of the plurality of memory array portions and having a fourth plurality of fuses associated with the third plurality of fuses and selectively opened to indicate a second defective memory portion of the plurality of memory array portions.

14. A memory circuit in accordance with claim 13, the fuse controller adapted to forward the second cell location described by the third plurality of fuses to the defective memory portion based on information indicated by the fourth plurality of fuses.

15. A method comprising the steps of:
    selectively opening any of a first plurality of fuses to describe a cell location within any of a plurality of memory array portions of a memory array;
    selectively opening any of a second plurality of fuses to indicate a defective memory array portion of the memory array.

16. A method in accordance with claim 15, further comprising the step of forwarding the cell location described by the first plurality of fuses to the defective memory array portion based on information indicated by the second plurality of fuses.

17. A method in accordance with claim 16, further comprising the steps of:

comparing a memory address with the cell location at the defective memory array portion; and activating a redundant memory cell at the defective memory array portion based on the cell location described by the first plurality of fuses.

18. A method in accordance with claim 17, further comprising the step of:

storing memory information in the redundant memory cell if the redundant cell is activated.

19. A method in accordance with claim 18, further comprising the steps of:

determining the cell location by testing the memory array to locate a defective memory cell; and determining the defective memory array portion by testing the memory array.

20. A method comprising the steps of:

determining a defective memory array portion of a plurality of memory array portions of a memory array;

determining a cell location of a defective memory cell within the defective memory array portion;

selectively opening any of a first plurality of fuses to describe the cell location within any of a plurality of memory array portions of the memory array;

selectively opening any of a second plurality of fuses to indicate the defective memory array portion of the memory array.

21. A method in accordance with claim 20, further comprising the step of forwarding the cell location described by the first plurality of fuses to the defective memory array portion based on information indicated by the second plurality of fuses.

22. A method in accordance with claim 21, further comprising the steps of:

comparing a memory address with the cell location at the defective memory array portion; and activating a redundant memory cell at the defective memory array portion based on the cell location described by the first plurality of fuses.

23. A method in accordance with claim 22, further comprising the step of:

storing memory information in the redundant memory cell if the redundant cell is activated.

24. A method in accordance with claim 20, further comprising the steps of:

counting a number of defective memory cells within the memory array; and discarding the memory array if the number is greater than a predetermined threshold.

* * * * *